(12) United States Patent
Bukkems

(10) Patent No.: US 6,687,267 B2
(45) Date of Patent: Feb. 3, 2004

(54) WIDELY TUNABLE LASER

(75) Inventor: Heino Bukkems, Eindhoven (NL)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 10/357,569

(22) Filed: Feb. 4, 2003

(65) Prior Publication Data

US 2003/0147432 A1 Aug. 7, 2003

Related U.S. Application Data

(60) Provisional application No. 60/354,830, filed on Feb. 6, 2002.

(51) Int. Cl.$^7$ ............................................. H01S 3/10
(52) U.S. Cl. .......................... 372/20; 372/64; 372/102; 372/29.015
(58) Field of Search ........................ 372/20, 64, 38.07, 372/102, 29.013, 372, 29.015

(56) References Cited

U.S. PATENT DOCUMENTS

| | | | | |
|---|---|---|---|---|
| 5,325,392 | A | * 6/1994 | Tohmori et al. | ............... 372/96 |
| 5,692,001 | A | 11/1997 | Tiemeijer | ..................... 372/44 |
| 5,987,050 | A | * 11/1999 | Doerr et al. | ................. 372/108 |
| 6,205,163 | B1 | 3/2001 | Hamamoto | ................... 372/43 |
| 6,445,722 | B2 | * 9/2002 | Hamamoto | ................... 372/46 |
| 6,501,872 | B2 | 12/2002 | Augustsson | ................... 385/24 |
| 6,504,856 | B1 | 1/2003 | Broberg et al. | .......... 372/38.07 |
| 2003/0147432 | A1 | * 8/2003 | Bukkems | ..................... 372/20 |

OTHER PUBLICATIONS

Jan–Olof Wesström et al., "Design of a Widely Tunable Grating Y–branch Laser using the Additive Vernier Effect for Improved Super–Mode Selection", 2002 IEEE International Semiconductor Laser Conference, Germany, Publication Date Oct. 2002, pp 99–100.

G.A. Fish et al., "Compact InGaAsP/InP 1×2 optical switch based on carrier induced suppression of modal interference", Electronics Letters, vol. 33, No. 22, Oct. 23$^{rd}$, 1997.

Pierre A. Besse et al., "Optical Bandwidth and Fabrication Tolerances of Multimode Interference Couplers", Journal of Lightwave Technology, vol. 12, No. 6, Jun. 1994, pp 1004–1009.

Shuichi Nagai et al., "Multimode Interference Photonic Switches (MIPS)", Journal of Lightwave Technology, vol. 20, No. 4, Apr. 2002, pp 675–681.

Juerg Leuthold et al., "Multimode Interference Couplers with Tunable Power Splitting Ratios", Journal of Lightwave Technology, vol. 19, No. 5, May 2001, pp 700–707.

* cited by examiner

*Primary Examiner*—Leon Scott, Jr.
(74) *Attorney, Agent, or Firm*—Allen, Dyer, Doppelt Milbrath & Gilchrist, P.A.

(57) ABSTRACT

A tunable laser having a tunable multi-mode interference (MMI) section is provided. The tunable laser also includes a gain section including an active waveguide, a phase section including a transparent waveguide, and a sampled grating section including a waveguide having a sampled Bragg grating written thereon or below. Each section is controlled via current injection. More specifically, the MMI section provides coarse tuning, the sampled grating section provides medium tuning, and the phase section provides fine tuning independence upon a current injected thereinto. The gain section provides optical gain. The configuration is relatively simple to control and easy to fabricate.

21 Claims, 7 Drawing Sheets

WIDELY TUNABLE LASER

CROSS-REFERENCE TO RELATED APPLICATIONS

This application claims priority from U.S. Provisional Appl. No. 60/354,830 filed on Feb. 6, 2002.

MICROFICHE APPENDIX

Not Applicable

FIELD OF THE INVENTION

The present invention relates generally to tunable lasers and, in particular, to a widely tunable laser having a tunable multi-mode interference section.

BACKGROUND OF THE INVENTION

Tunable lasers play an important role in the dense wavelength division multiplexing (DWDM) systems that form the backbone of today's optical communication network. In particular, they are generally regarded as being the preferred transmitters of future long distance and metropolitan optical systems. In this regard, the term "tunable laser" is typically applied to a single-wavelength laser, wherein the wavelength can be varied in a controlled manner. For example, laser diodes are frequently used to fabricate tunable lasers.

A laser diode is a p-n junction semiconductor that is operated with an input current sufficiently high to produce gain to compensate optical and mirror losses. Typically, two cleaved facet ends define the laser cavity, and serve as mirrors to reflect light back and forth throughout the "gain medium". In one embodiment, wavelength selectivity is imparted to the laser with a Bragg grating(s), or modified Bragg grating(s). The Bragg grating(s) are positioned near one or more of the cleaved facets ends, as for example found in distributed Bragg reflector (DBR) lasers, or are distributed throughout the laser cavity, as for example found in distributed feedback (DFB) lasers. Wavelength tuning is generally accomplished by changing the optical path length of the cavity and/or modifying the Bragg wavelength of the grating. In either case, this is most conveniently performed by changing the refractive index, which is optionally achieved by current injection, voltage bias and/or altering the temperature.

Referring to FIG. 1, there is shown a prior art three-section DBR tunable laser. The tunable laser 100 includes an optical gain section 101, a phase control section 102, and a tunable Bragg grating section 103. A first current source 104 pumps the gain section 101 to generate optical gain, a second current source 105 injects carriers to adjust the optical path length of the cavity such that the laser resonant frequency approximately matches the peak of the Bragg grating, and a third current source 106 controls the reflectivity peak by changing the effective refractive index $n_{eff}$ of the Bragg grating 103. Light is output on the right hand side of the device, as indicated by the arrow. A wavelength tuning range of about 6–12 nm is achieved using this design.

Widely tunable lasers, which for example have a tuning range greater than about 30–40 nm, present an inherently difficult problem because they cover a wider tuning range than the material tuning range. At the same time, very precise wavelength selection and high stability is required. In order to extend the tuning range of diode lasers, various modifications to DBR lasers have been proposed.

In the sampled-grating distributed Bragg reflector (SG-DBR) laser, the Bragg grating is replaced with a sampled grating. A sampled grating is essentially a modified Bragg grating, wherein grating teeth are periodically removed along the length of the grating (i.e. the grating is "sampled"). Sampled gratings exhibit a comb-like reflectance spectrum, wherein the spacing between comb peaks is inversely proportional to the period of the sampling. FIG. 2 is a schematic diagram of a prior art SG-DBR. The SG-DBR includes a front sampled grating section 202, a gain section 204, a phase section 206, and a back sampled grating section 208. The sampled gratings 202a, 208a serve as wavelength selective mirrors that form the laser cavity. In accord with the Vernier effect, the front and back sampled gratings are sampled at different periods such that the comb pitch of the comb-like reflectance spectra are different, and such that only one peak from each of the two different reflection spectra can overlap. Tuning the laser is accomplished by adjusting the refractive index within each of the front and back sampled gratings, such that all of the reflection peaks simultaneously move until the closest reflection peak of each grating is aligned at the desired channel, and lasing occurs. In other words, the SG-DBR laser overcomes the aforementioned difficult problem by using a tuning mechanism with two degrees of freedom. Instead of using one knob with really fine control, two knobs with coarser control are used in tandem.

In the grating-assisted coupler with sampled rear reflector laser, also referred to as the Grating assisted co-directional Coupler with Sampled grating Reflector (GCSR) laser, the aforementioned difficult problem is overcome by providing a first knob to, coarsely define the wavelength range of the desired channel and at least a second knob for fine tuning to the desired channel. The prior art GCSR, which is illustrated in FIG. 3, includes a gain section 302, a coupler section 304, a phase section 306, and a back sampled grating section 308. Each of the sections is controlled by injecting current thereinto. In particular, injecting current into the coupler section 304, the back sampled grating section 308, and the phase section 306 corresponds to coarse, medium, and fine tuning, respectively. Accordingly, the control is easier and more straight forward than in the SG-DBR laser. Unfortunately, the grating assisted coupler is associated with a more complicated fabrication, since there are two waveguides in the transverse direction. Furthermore, the ideal coupler length is highly fabrication dependent.

It is an object of the instant invention to provide a tunable laser having separate coarse, medium, and/or fine tuning.

It is a further object of the instant invention to provide a tunable laser that is relatively simple to control and easy to fabricate.

SUMMARY OF THE INVENTION

The instant invention relates to a tunable laser having a tunable multi-mode interference (MMI) section. Preferably, the MMI section is tuned by current injection into predetermined regions thereof. Advantageously, this configuration provides separate coarse, medium, and fine-tuning. Moreover, this configuration is relatively simple and easy to fabricate.

In accordance with the invention there is provided a tunable laser comprising: a gain section including an active waveguide and a first current injector, the first current injector for injecting current into the active waveguide so as to provide optical gain; a phase section including a transparent waveguide and a second current injector, the second current injector for injecting current into the transparent waveguide so as to produce a refractive index change therein, the transparent waveguide optically coupled to the active waveguide; a multi-mode interference section including a multi-mode waveguide and a third current injector, the third current injector for injecting current into the multi-mode waveguide so as to produce local refractive index changes therein, the multi-mode waveguide optically coupled to the transparent waveguide; and a sampled grating section including another transparent waveguide and a fourth current injector, the other transparent waveguide coupled to a sampled Bragg grating, the fourth current injector for injecting current into the sampled Bragg grating so as to produce a refractive index change therein, the other transparent waveguide optically coupled to the multi-mode waveguide.

In accordance with the instant invention there is provided a tunable laser comprising: a substrate; an optical waveguide disposed on the substrate, the optical waveguide extending from a port on a front facet of the substrate towards an opposing end of the substrate; a sampled Bragg grating disposed near the optical waveguide proximate the opposing end, the sampled Bragg grating for reflecting predetermined wavelengths and forming a laser cavity with the front facet; and an active region disposed in the optical waveguide proximate the front facet, the active region for providing optical gain within the laser cavity, wherein the optical waveguide includes a multi-mode interference region disposed between the active region and the sampled Bragg grating, the multi-mode interference region for passing a range of wavelengths such that substantially only one of the predetermined wavelengths is output the port on the front facet, the range of wavelengths being variable in dependence upon an applied current to the multi-mode interference region.

In accordance with the instant invention there is further provided a method of tuning a laser having a gain section, a phase section, a multi-mode interference section, and a sampled Bragg grating section, the method including the steps of: injecting current into a multi-mode interference waveguide disposed within the multi-mode interference section, the current injected in at least one predetermined location selected in dependence upon a desired tuning direction and with a magnitude selected in dependence upon a desired output wavelength of the laser.

BRIEF DESCRIPTION OF THE DRAWINGS

Exemplary embodiments of the invention will now be described in conjunction with the following drawings wherein like numerals represent like elements, and wherein:

FIG. 5b is a side view of the tunable laser illustrated in FIG. 5a;

FIG. 5c is a top view of the tunable laser illustrated in FIG. 5a;

DETAILED DESCRIPTION OF THE PREFERRED EMBODIMENTS

The instant invention relates to a tunable laser that includes a multimode interference section to tune the laser. The multimode interference (MMI) section includes a wide waveguide through which several modes can propagate. Preferably, the wide waveguide is constructed with a length, height, and width that causes it to act as an MMI coupler having a single input and a single output.

Figure 1:
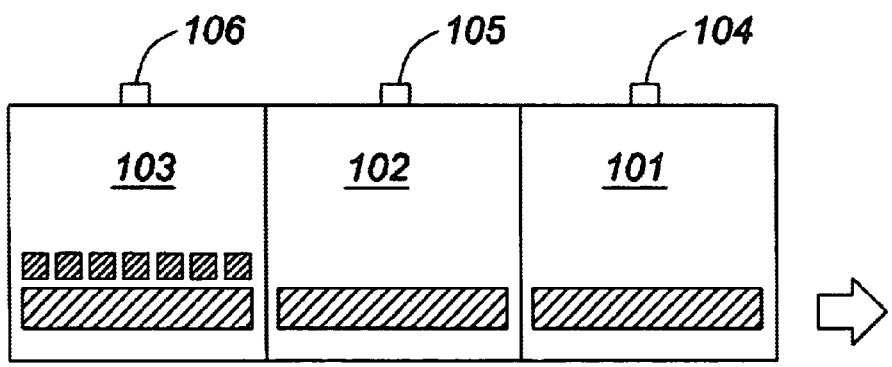
FIG. 1 is a schematic diagram of a prior art DBR laser.
Figure 2:
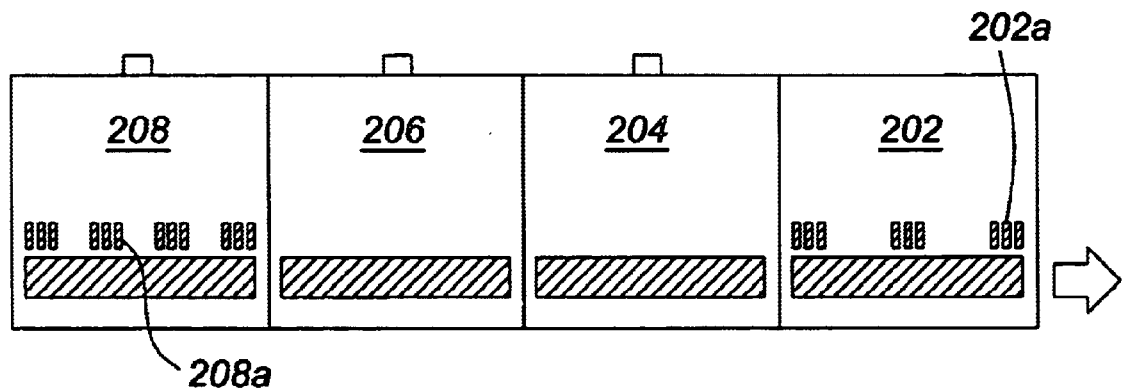
FIG. 2 is a schematic diagram of a prior art SG-DBR laser.
Figure 3:
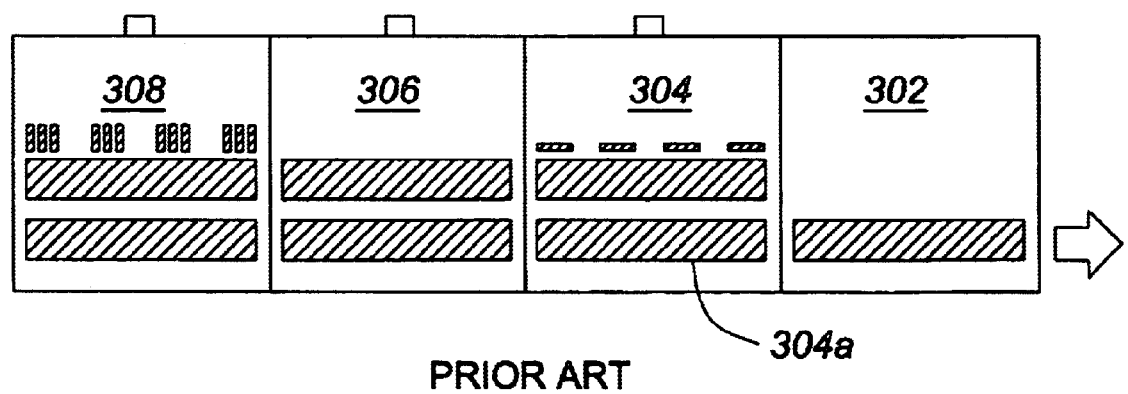
FIG. 3 is a schematic diagram of a prior art GCSR laser.
Figure 4A:
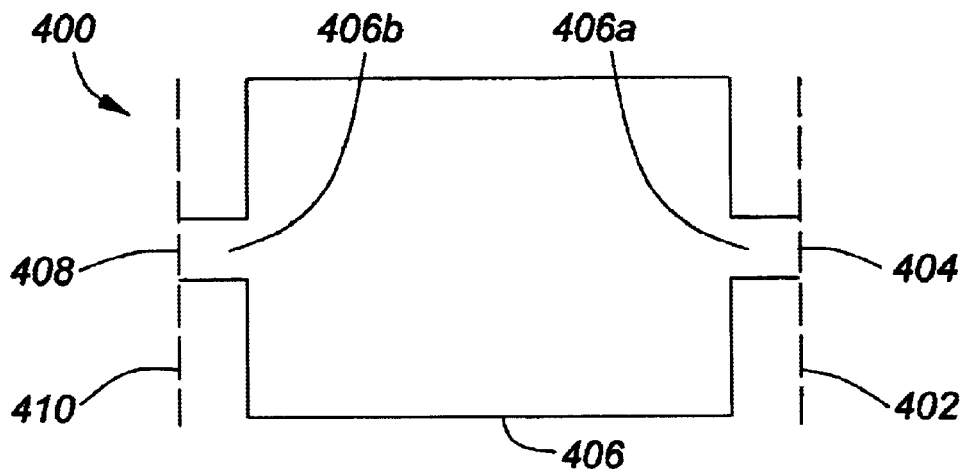
FIG. 4a is a schematic diagram of a multi-mode interference section in accordance with one embodiment of the instant invention.
Figure 4B:
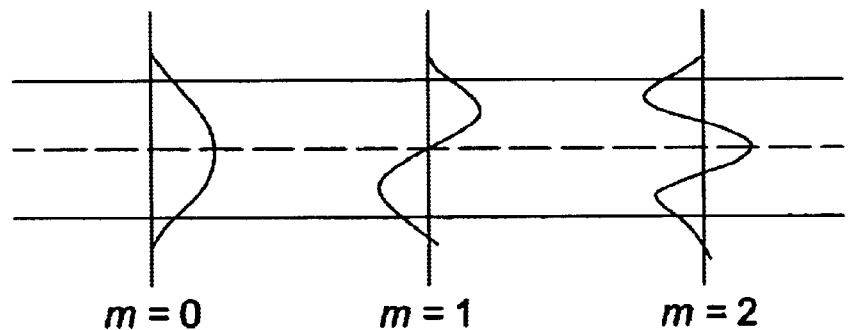
FIG. 4b is a schematic diagram showing different propagation modes.

An MMI section in accordance with one embodiment of the instant invention is shown in FIG. 4a. The MMI section 400 includes an input end 402, a single-mode waveguide 404, a wide, multi-mode waveguide 406, another single-mode waveguide 408, and an output end 410. Light launched into the input end 402 propagates through the single-mode waveguide 404 and into a first end 406a of the wide waveguide 406. The wide waveguide 406 allows the light to decompose into its different propagation modes (e.g., 0, 1, 2 shown in FIG. 4b). The modes are not uniformly distributed over the width of the MMI section 406. As the different modes propagate through the wide waveguide 406, they constructively and/or destructively interfere with one another at specific locations. The wide waveguide 406 is designed with a length such that, for a given wavelength, the output 406b is positioned at a specific location wherein the phase difference between all modes is an integer times $2\pi$ (i.e., at the focus point). At this focal length, the input field is reconstructed and the light can be coupled into the single-mode waveguide 408 with high efficiency for a specific wavelength.

Figure 4C:
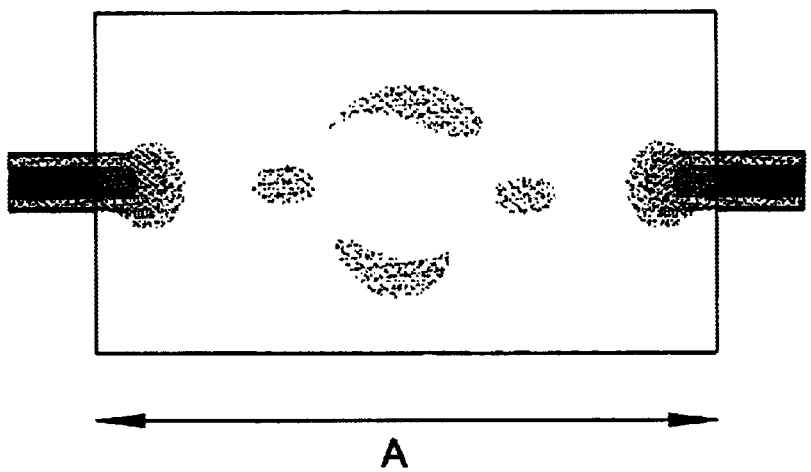
FIG. 4c is a schematic diagram illustrating the interference pattern of different modes within a multi-mode interference waveguide.

A diagram showing the constructive/destructive interference pattern in a multi-mode interference waveguide is illustrated in FIG. 4c. In this figure, the distance A corresponds to the length of the wide waveguide in FIG. 4a (i.e., the distance wherein an image is reconstructed). The figure shows a special MMI configuration with symmetric input.

As alluded to above, however, the input light will only be fully reconstructed at 406b if the light is of a predetermined wavelength. In general, light close in wavelength to the predetermined wavelength will also be transmitted through output 406b such that the transmission spectrum corresponds to a relatively broad curve. The peak of this transmission spectrum is shifted by injecting current into the wide waveguide 406 at a predetermined location, or locations, such that the effective refractive index, nff, of specific propagation modes are affected. This affects the constructive/destructive interference, and hence the focal length, and causes different wavelengths to be transmitted with greater efficiency.

Figure 4D:
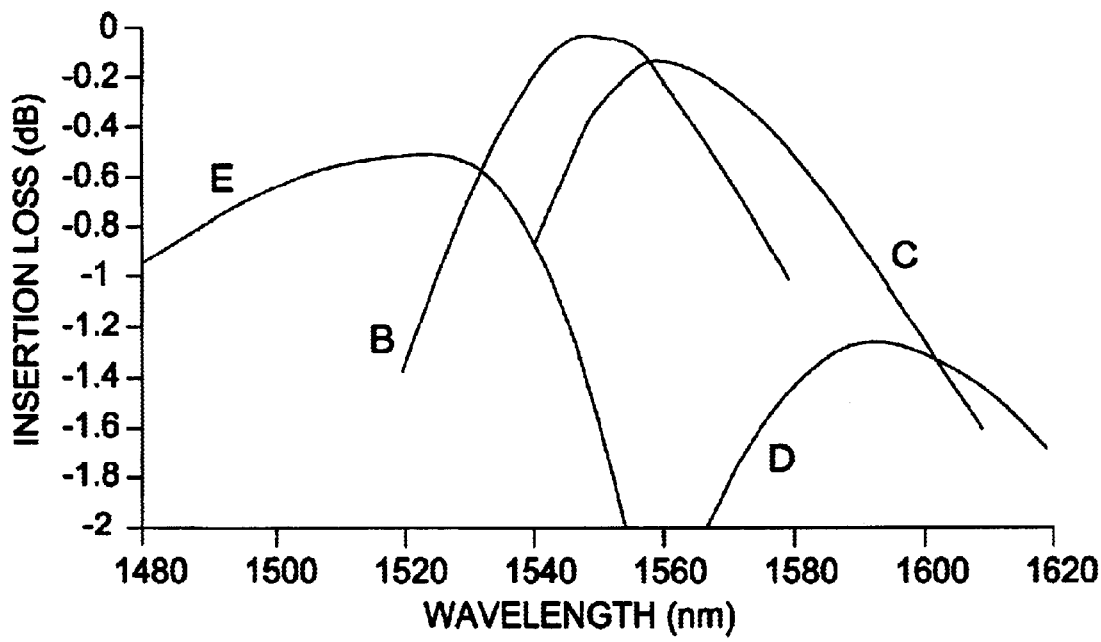
FIG. 4d shows calculated transmission spectra illustrating the wavelength shift provided by different current injections in a multi-mode interference waveguide.
Figure 4E:
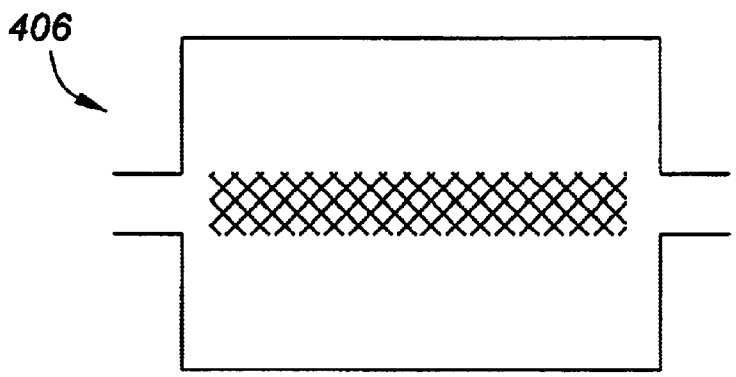
FIG. 4e is a schematic diagram showing current injection into a central region of a multi-mode interference waveguide.
Figure 4F:
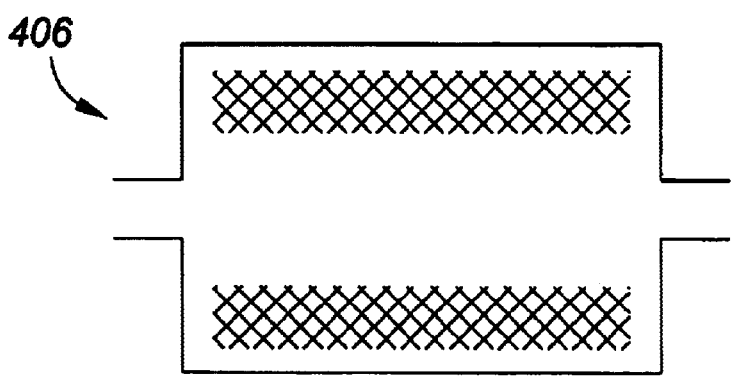
FIG. 4f is a schematic diagram showing current injection into two edge regions of a multi-mode interference waveguide.
Figure 4G:
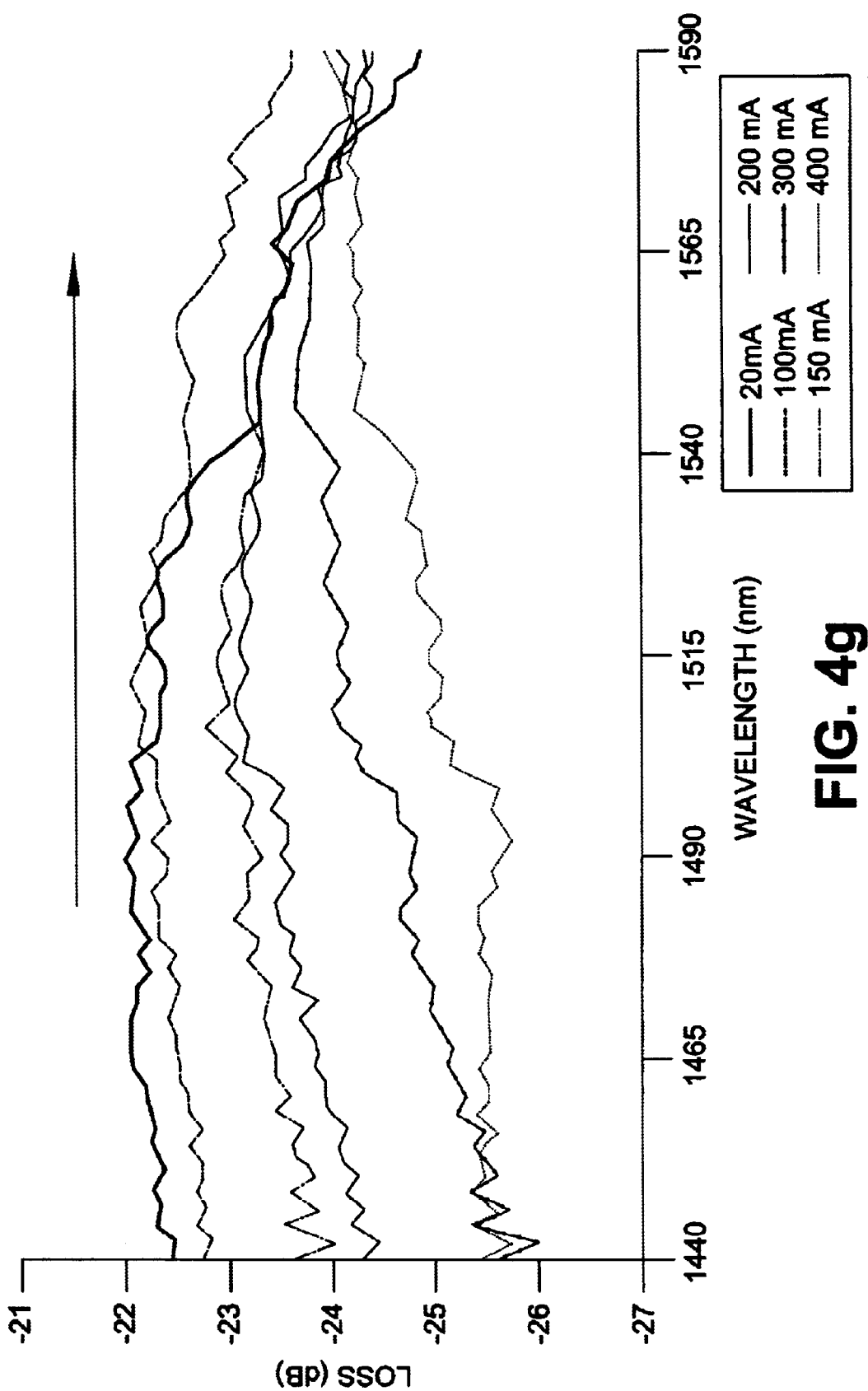
FIG. 4g shows experimental transmission spectra illustrating the wavelength shift provided by different current injections in a multi-mode interference waveguide.

FIG. 4d illustrates the calculated transmission characteristics of the MMI section for different current injections. The central curve B, no injection current, has a peak maximum at 1550 nm. Curve C is obtained when a small current is injected into a central region of the wide waveguide as illustrated in FIG. 4e. Curve D is obtained when a larger current injection is applied to the same central region. The curve, E, is obtained when a small current is injected into two outside regions of the wide waveguide, as shown in FIG. 4f. In the latter embodiment, the current injection is controlled by a single control that is connected to two electrodes, each electrode coupled to one of the two outside regions. For comparison, the experimental transmission characteristics of the MMI section having a centrally positioned electrode/contact is shown in FIG. 4g.

Figure 4H:
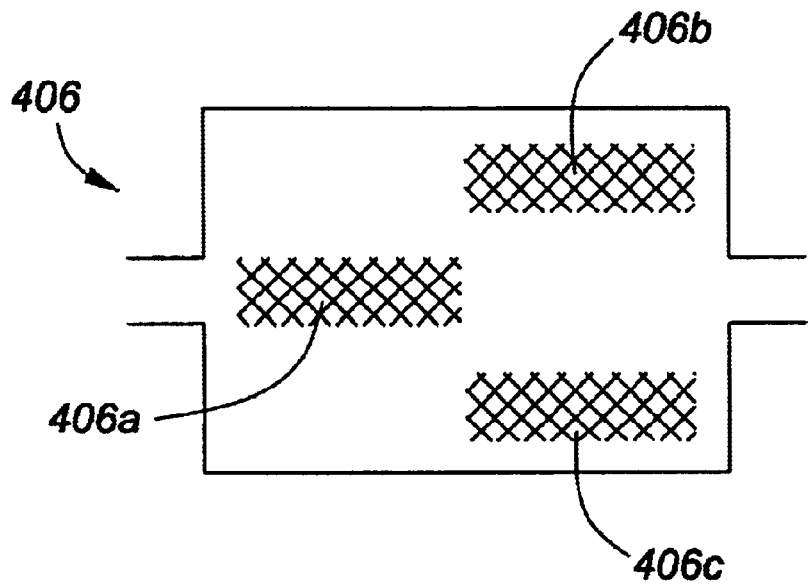
FIG. 4h is a schematic diagram showing current injection into three different regions of a multi-mode interference waveguide.

Referring to FIG. 4h, there is shown a third embodiment wherein current injection is performed via three electrodes so as to achieve tuning over a wider wavelength range. In particular, one half of the wide waveguide 406 is controlled by a centrally disposed electrode 406a, while the other half is controlled by two electrodes 406b,c that are connected. As observed from FIG. 4d, the MMI section is tuned by changing the effective refractive index of one or more of these regions, and thus shifting the relatively broad transmission curve in a red or blue direction.

Figure 4I:
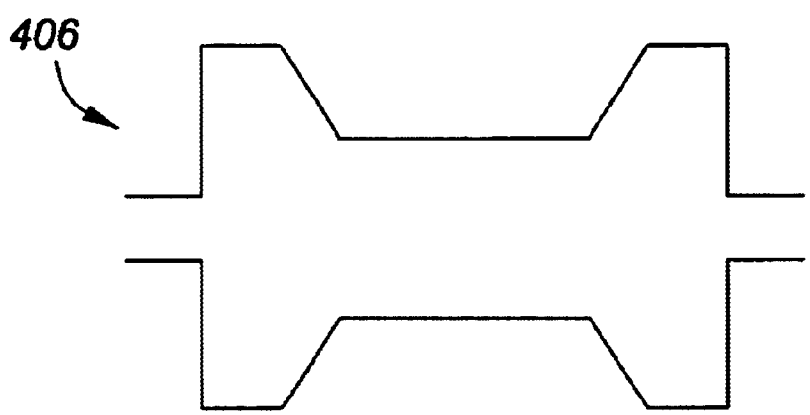
FIG. 4i is a schematic diagram of a tapered multi-mode interference waveguide.

Optionally, the wide waveguide 406 is tapered as illustrated in FIG. 4i. It is anticipated that providing a tapered multi-mode waveguide will reduce the required length of the MMI section 400, without affecting the optical bandwidth.

Notably, the use of a tunable MMI 1×1 coupler provides a novel, simple, compact design that potentially provides wavelength selectivity over 100 nm. Although MMI couplers have been tuned, e.g., with current injection, to provide variable splitting ratios, MMI couplers have not been used to provide wavelength selectivity. For example, see G. A. Fish, L. A. Coldren and DenBaars, "Compact InGaAsP/InP 1×2 optical switch based on carrier induced suppression of modal interference", Electron. Lett., vol. 33, no. 22, 1997, J. Leuthold and C. H. Joyner, "Multimode interference couplers with tunable power splitting ratios", J. Lightwave Technol., vol 19, no. 5, pp. 700, 2001, and S. Nagai, G. Morishima, H. Inayoshi, and K. Ukaka, "Multi-mode interference photonic switches", J Lightwave Technol., vol. 20, no. 4, pp. 675, 2002, incorporated herein by reference.

Furthermore, although a 1×1 coupler has been shown for exemplary purposes, a 1×N or N×N coupler is also within the scope of the instant invention.

Figure 5A:
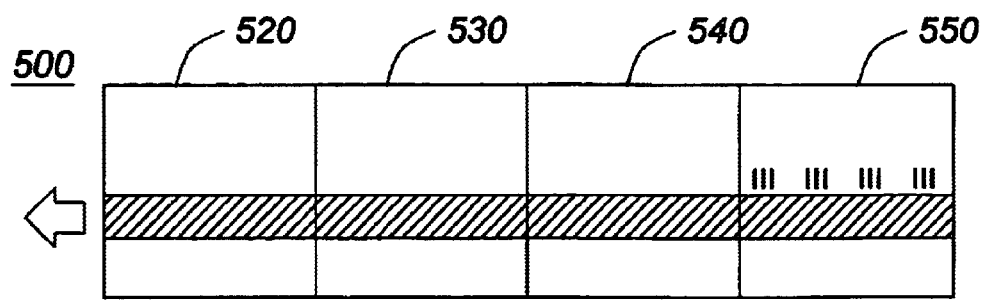
FIG. 5a is a schematic block diagram of a tunable laser in accordance with an embodiment of the instant invention.

Now turning to FIG. 5a, there is shown a schematic diagram of a tunable laser in accordance with the instant invention. The tunable laser 500 includes a gain section 520, a phase section 530, an MMI section 540, and a grating section 550. In this embodiment, the phase section is disposed between the gain section and the MMI section. In another embodiment, the phase section is disposed between the MMI section and the grating section.

Figure 5B:
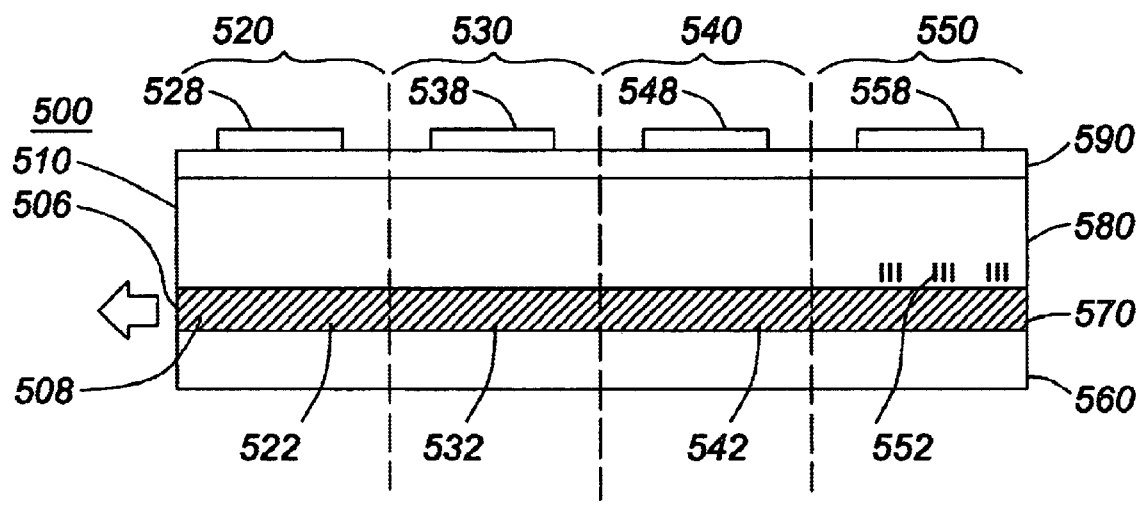

Referring to the side view shown in FIG. 5b, each section 520, 530, 540, and 550 includes a common substrate 560, such as an n-type indium phosphide (InP) substrate, a cladding layer 580, such as a p-type InP layer, a cap layer 590, such as an InGaAs layer, and an electrode. More specifically, the gain section 520 includes a first electrode 528, the phase section 530 includes a second electrode 538, the MMI section 540 includes a third electrode 548, and the grating section 550 includes a fourth electrode 558. The sections are electrically isolated from one another. An active layer 506, such as a bulk material or alternatively a quantum well stack, is provided in the gain section 520. A waveguiding layer 570, such as an indium gallium arsenide phosphide (InGaAsP) layer having a bandgap wavelength of e.g. 1430 nm, is provided in the phase section 530, the MMI section 540, and the grating section 550.

Figure 5C:
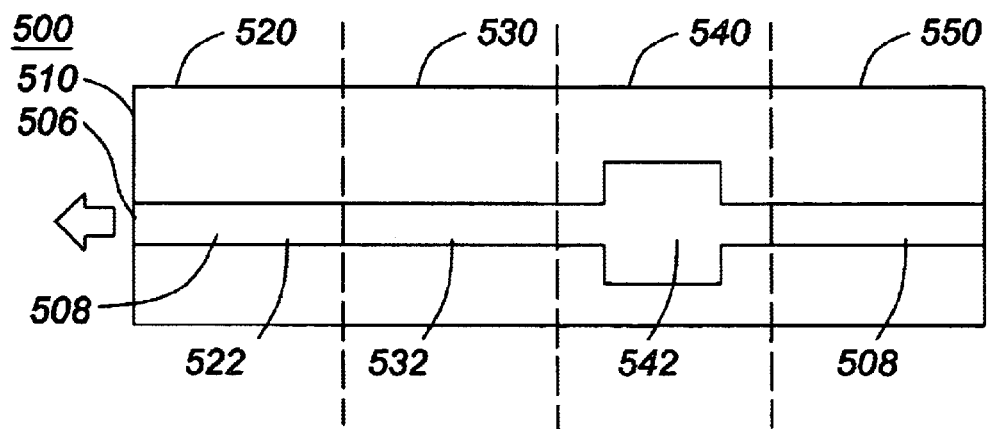

The tunable laser 500 also includes an active region 522 disposed in the gain section 520, a transparent region 532 disposed in the phase section 530, a MMI waveguide 542 disposed in the MMI section 540, and a sampled grating Bragg reflector 552 disposed in the grating section 550. The MMI waveguide 542 is a multi-mode interference waveguide as discussed, for example, above with respect to FIGS. 4a–h. Sampled Bragg gratings and active regions are well known in the field of tunable lasers, and are not discussed further. Preferably, the active region 522 is an active waveguide that is aligned (i.e., in plane) with the waveguiding layer 570 (e.g., by a buttjoint growth process). Alternatively, the waveguiding layer 570 extends into the gain section 520 and the active region is disposed on the waveguiding layer such that, when a current is applied thereto, light is produced and is guided into the waveguiding layer 570. Preferably, the active waveguide is made of uniform material or a stack of quantum wells. Similarly, it is preferred that the waveguiding 522/570 and cladding 580 layers be designed to provide a single mode waveguide 508 extending through each of the sections, except the MMI section 540, wherein the MMI waveguide 542 is formed (see FIG. 5c). Preferably, the sampled grating 552 is written at or near an interface of the waveguiding layer 570 and one of the substrate 560 and cladding 580 layers, such that light of predetermined wavelengths propagating through the waveguide will be reflected. For example, the sampled grating is optionally disposed on or below the waveguide 508.

In operation, a current bias is applied to the electrode 528 of the gain section 520, such that holes and electrons are injected into the active waveguide and light is produced. The light propagates through the waveguiding layers 522/570 and oscillates between a front facet 510 of the substrate 560 and the sampled Bragg grating 552 (i.e., within the laser cavity). When the current injection is above the threshold value net amplification and steady-state lasing is obtained. The optical gain profile of the gain section 520 is typically about 100 nm wide.

Figure 6A:
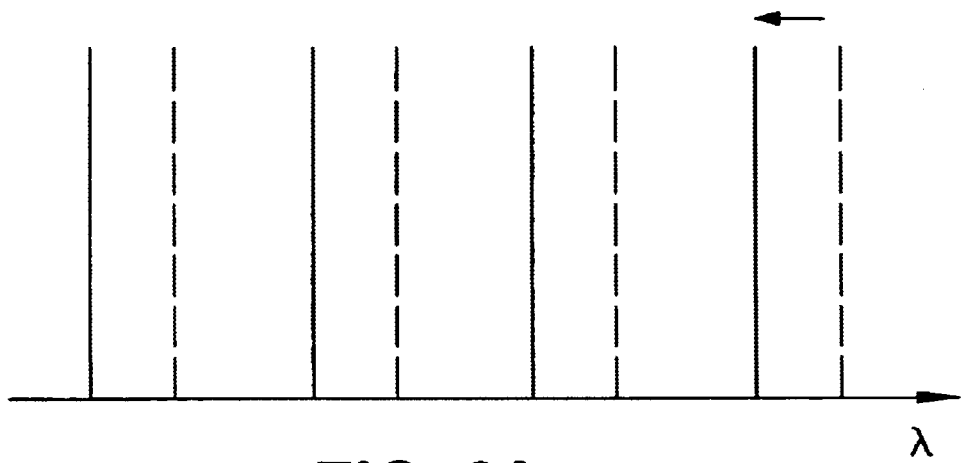
FIG. 6a shows the reflection spectra of a sampled Bragg grating before (dashed lines) and with (solid lines) current injection.

The oscillating light passes into the grating section 550, wherein the sampled Bragg grating 552 reflects one or more predetermined wavelengths of light with a higher efficiency than light of other wavelengths. In particular, the sampled Bragg grating exhibits a comb-like reflection spectrum, as illustrated with dashed lines in FIG. 6a. When a current is injected into the sampled Bragg grating 552, the refractive index therein is decreased and the entire reflection spectrum is shifted towards shorter wavelengths, as for example shown with solid lines in FIG. 6a. Wavelength shifts of about 10 nm are typical.

Figure 6B:
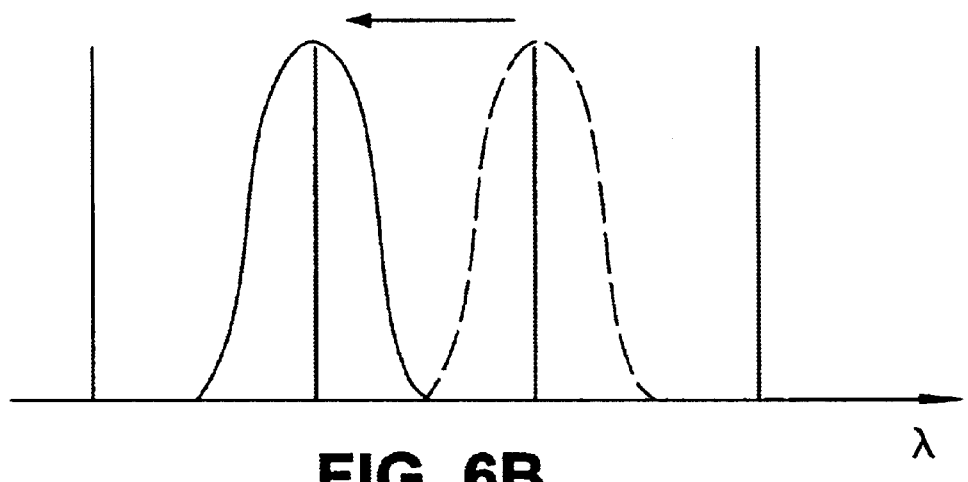
FIG. 6b shows the transmission spectra of a multi-mode interference waveguide before (dashed curve) and with (solid curve) current injection, relative to the reflection spectrum of the sampled grating.
Figure 6C:
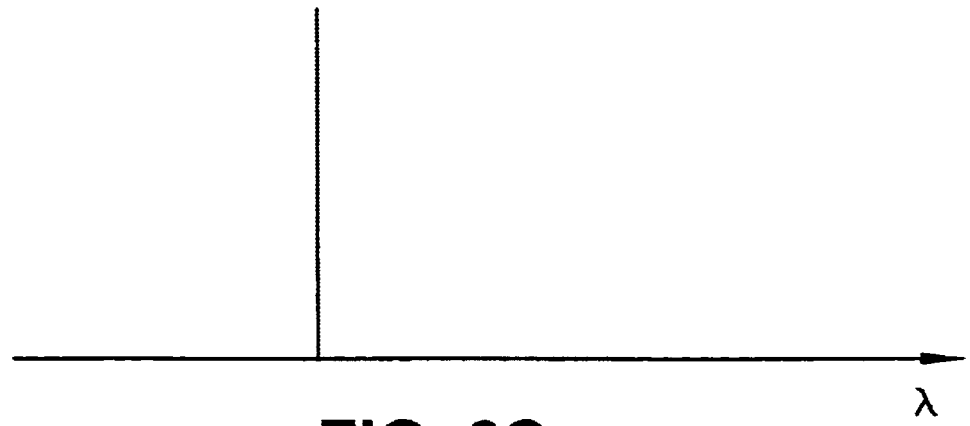
FIG. 6c shows the wavelength of a tunable laser in accordance with an embodiment of the instant invention.

When the oscillating light passes through the MMI section 540, only one of the predetermined wavelengths will be transmitted with significant intensity. In particular, the transmission characteristic of the MMI section, which for example is shown with a dotted line in FIG. 6b, suppresses all or most of the other reflection peaks reflected from the Bragg grating. The MMI section 540 is tuned by injecting current into specific locations of the MMI waveguide 542 as discussed above. In particular, current injected into a central region of the MMI waveguide 542 (as discussed with respect to FIG. 4e) causes the peak of the transmission curve to shift to higher wavelengths, while current injected into edge regions of the MMI waveguide 542 (as discussed with respect to FIG. 4f), causes the peak of the transmission curve to shift to lower wavelengths (as shown with a solid curve in FIG. 6b). Preferably, the resulting output corresponds to a single wavelength, as shown in FIG. 6c.

In order to fine tune the laser wavelength at the port 506 on the front facet 510, current is injected into the single-mode waveguide in the phase section 530 to match the cavity optical length to the wavelength.

In effect, the MMI section provides coarse tuning, the grating section provides medium tuning, and the phase section provides fine wavelength tuning for the laser. Since the laser is controlled with separate fine, medium, and coarse tuning, the control is easier and the device more stable than prior art tunable lasers based on the Vernier effect. The wavelength selectivity is optionally performed by coarse scanning, followed by medium scanning, and/or is calculated from a look-up table of frequency versus current.

Advantageously, the gain, MMI, phase and grating sections in the above embodiment are monolithically integrated on a single semiconductor substrate 560. As a result, the tunable laser is more compact, robust, and provides simpler handling. Moreover, the in-plane combination of the coarse, medium and fine tuning sections makes fabrication easier. Of course, it is also possible for one or more of these sections to be fabricated on separate substrates and/or in optical fibres.

Since the gain section illustrated in the above embodiments is located at the output facet of the laser, the amplified signal does not incur losses from the other sections and the tunable laser is associated with a high output power.

Of course, numerous other embodiments may be envisaged, without departing from the spirit and scope of the invention. For example, the instant invention is not limited to operating in the C-band (e.g., around 1550 nm), but also extends to other wavelength ranges depending on the materials used.

What is claimed is:

1. A tunable laser comprising:
   a gain section including an active waveguide and a first current injector, the first current injector for injecting current into the active waveguide so as to provide optical gain;
   a phase section including a transparent waveguide and a second current injector, the second current injector for injecting current into the transparent waveguide so as to produce a refractive index change therein, the transparent waveguide optically coupled to the active waveguide;
   a multi-mode interference section including a multi-mode waveguide and a third current injector, the third current injector for injecting current into the multi-mode waveguide so as to produce local refractive index changes therein, the multi-mode waveguide optically coupled to the transparent waveguide; and
   a sampled grating section including another transparent waveguide and a fourth current injector, the other transparent waveguide coupled to a sampled Bragg grating, the fourth current injector for injecting current into the sampled Bragg grating so as to produce a refractive index change therein, the other transparent waveguide optically coupled to the multi-mode waveguide.

2. A tunable laser according to claim 1, wherein the multi-mode waveguide comprises a multi-mode interference coupler.

3. A tunable laser according to claim 1, wherein the third current injector comprises at least one electrode for injecting current into the multi-mode waveguide so as to shift the transmission peak of the multi-mode interference section.

4. A tunable laser according to claim 1, wherein the third current injector includes an electrode for injecting current in a central region of the multi-mode waveguide, the central region being coaxial with an optical axis of the multi-mode waveguide.

5. A tunable laser according to claim 1, wherein the third current injector includes first electrode for injecting current in a first region of the multi-mode waveguide and a second electrode for injecting current in a second region of the multi-mode waveguide, the first and second regions symmetrically disposed about an optical axis of the multi-mode waveguide.

6. A tunable laser according to claim 4, wherein the third current injector includes a second electrode for injecting current in a second region of the multi-mode waveguide and a third electrode for injecting current in a third region of the multi-mode waveguide, the second and third regions symmetrically disposed about an optical axis of the multi-mode waveguide.

7. A tunable laser according to claim 1, wherein the first, second, third and fourth current injectors are electrodes.

8. A tunable laser according to claim 1, wherein the multi-mode waveguide is tapered.

9. A tunable laser according to claim 1, wherein the active waveguide, transparent waveguide, multi-mode waveguide and the other transparent waveguide are disposed in a same plane.

10. A tunable laser comprising:
    a substrate;
    an optical waveguide disposed on the substrate, the optical waveguide extending from a port on a front facet of the substrate towards an opposing end of the substrate;
    a sampled Bragg grating disposed near the optical waveguide proximate the opposing end, the sampled Bragg grating for reflecting predetermined wavelengths and forming a laser cavity with the front facet; and
    an active region disposed in the optical waveguide proximate the front facet, the active region for providing optical gain within the laser cavity,
    wherein the optical waveguide includes a multi-mode interference region disposed between the active region and the sampled Bragg grating, the multi-mode interference region for passing a range of wavelengths such that substantially only one of the predetermined wavelengths is output the port on the front facet, the range of wavelengths being variable in dependence upon an applied current to the multi-mode interference region.

11. A tunable laser according to claim 10, wherein the multi-mode interference region comprises a multi-mode interference waveguide having a first port disposed on a first end and a second port disposed on a second end, opposing the first port.

12. A tunable laser according to claim 10, comprising a transparent waveguide disposed between the active region and the sampled Bragg grating.

13. A tunable laser according to claim 12, comprising a first current injector for injecting current into the active region, a second current injector for injecting current into the transparent waveguide, a third current injector for injecting current into the multi-mode interference waveguide, and a fourth current injector for injecting current into the sampled Bragg grating.

14. A tunable laser according to claim 13, wherein the third current injector includes an electrode for injecting current into at least one of a central region of the multi-mode waveguide and edge regions of the multi-mode waveguide.

15. A tunable laser according to claim 10, wherein the multi-mode interference section comprises a tapered waveguide.

16. A tunable laser according to claim 10, wherein the multi-mode interference section comprises a multi-mode waveguide disposed on the substrate in a same plane as the sampled Bragg grating.

17. A tunable laser according to claim 10, wherein the multi-mode interference section comprises a symmetric MMI coupler.

18. A method of tuning a laser having a gain section, a phase section, a multi-mode interference section, and a sampled Bragg grating section, the method including the steps of:

injecting current into a multi-mode interference waveguide disposed within the multi-mode interference section, the current injected in at least one predetermined location selected in dependence upon a desired tuning direction and with a magnitude selected in dependence upon a desired output wavelength of the laser.

19. A method according to claim 18, comprising the step of adjusting the current injected into the multi-mode interference waveguide so as to vary the output wavelength of the laser.

20. A method according to claim 18, wherein the step of injecting current comprises selecting the predetermined location to be a central region of the multi-mode interference waveguide.

21. A method according to claim 18, wherein the step of injecting current comprises selecting the predetermined location to be at least one edge region of the multi-mode interference waveguide.

* * * * *

UNITED STATES PATENT AND TRADEMARK OFFICE
CERTIFICATE OF CORRECTION

PATENT NO.   : 6,687,267 B2
DATED        : February 3, 2004
INVENTOR(S)  : Bukkems It is certified that error appears in the above-identified patent and that said Letters Patent is hereby corrected as shown below:

Column 5,
Line 7, "index, nff, of" should read -- index, $n_{eff,}$ of --

Signed and Sealed this

Twenty-ninth Day of June, 2004

JON W. DUDAS
*Acting Director of the United States Patent and Trademark Office*